(12) United States Patent
Eom et al.

(10) Patent No.: US 12,273,605 B2
(45) Date of Patent: Apr. 8, 2025

(54) IMAGE SENSOR PACKAGE AND CAMERA DEVICE COMPRISING SAME

(71) Applicant: LG INNOTEK CO., LTD., Seoul (KR)

(72) Inventors: Seong Su Eom, Seoul (KR); Jun Phill Eom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 132 days.

(21) Appl. No.: 18/014,626

(22) PCT Filed: May 6, 2021

(86) PCT No.: PCT/KR2021/005666
§ 371 (c)(1),
(2) Date: Jan. 5, 2023

(87) PCT Pub. No.: WO2022/014835
PCT Pub. Date: Jan. 20, 2022

(65) Prior Publication Data
US 2023/0276112 A1   Aug. 31, 2023

(30) Foreign Application Priority Data
Jul. 16, 2020   (KR) .................. 10-2020-0088318

(51) Int. Cl.
*H01L 27/146*   (2006.01)
*H04N 23/12*   (2023.01)
(Continued)

(52) U.S. Cl.
CPC ........... *H04N 23/12* (2023.01); *H01L 27/146* (2013.01); *H01L 27/14618* (2013.01);
(Continued)

(58) Field of Classification Search
None
See application file for complete search history.

(56) References Cited

U.S. PATENT DOCUMENTS 6,566,745 B1 *   5/2003   Beyne ............... H01L 27/14618
257/784
6,972,497 B2 *   12/2005   Prior ................. H01L 27/14618
257/730
(Continued)

FOREIGN PATENT DOCUMENTS

FR   2 986 902   8/2013
KR   10-2005-0096471   10/2005
(Continued)

OTHER PUBLICATIONS

International Search Report (with English Translation) dated Aug. 13, 2021 issued in Application No. PCT/KR2021/005666.

*Primary Examiner* — Twyler L Haskins
*Assistant Examiner* — Wesley J Chiu
(74) *Attorney, Agent, or Firm* — KED & ASSOCIATES, LLP

(57) ABSTRACT

An image sensor package, according to one embodiment of the present invention, comprises: a printed circuit board; an image sensor disposed on the printed circuit board; a first support part disposed on the image sensor; a filter layer disposed on the image sensor; a second support part disposed on the printed circuit board, to the side of the image sensor; a wire part which is disposed between the first support part and the second support part, and of which one end is connected to the image sensor and the other end is connected to the printed circuit board; and a molding member filling the gap between the first support part and the second support part.

17 Claims, 13 Drawing Sheets

(51) Int. Cl.
*H04N 23/55* (2023.01)
*H04N 23/57* (2023.01)
*H05K 1/02* (2006.01)
*H05K 3/46* (2006.01)

(52) U.S. Cl.
CPC ............ *H04N 23/55* (2023.01); *H04N 23/57* (2023.01); *H05K 1/0233* (2013.01); *H05K 3/4694* (2013.01); *H05K 2201/10151* (2013.01); *H05K 2201/10287* (2013.01)

(56) References Cited

U.S. PATENT DOCUMENTS

| | | | | |
|---|---|---|---|---|
| 2002/0093026 | A1* | 7/2002 | Huang | H01L 27/14618 257/98 |
| 2004/0065952 | A1* | 4/2004 | Prior | H01L 31/0203 257/724 |
| 2006/0163720 | A1 | 7/2006 | Hirata | |
| 2010/0181489 | A1* | 7/2010 | Okada | H01L 31/0203 250/370.01 |
| 2013/0264703 | A1* | 10/2013 | Tae | H01L 27/14618 257/737 |
| 2016/0241749 | A1* | 8/2016 | Alasimiö | H04N 23/57 |
| 2016/0260761 | A1* | 9/2016 | Jun | H01L 27/14636 |
| 2017/0280027 | A1* | 9/2017 | Wang | H04N 23/55 |
| 2018/0273376 | A1 | 9/2018 | Feyh et al. | |
| 2019/0165019 | A1* | 5/2019 | Wang | H01L 27/14634 |
| 2020/0111829 | A1* | 4/2020 | Fan | H01L 27/14683 |
| 2020/0312897 | A1* | 10/2020 | Hsieh | H01L 27/14618 |
| 2020/0373341 | A1* | 11/2020 | Jo | H01L 24/06 |
| 2022/0011565 | A1* | 1/2022 | Zhang | H04N 23/57 |

FOREIGN PATENT DOCUMENTS

| | | |
|---|---|---|
| KR | 10-2006-0003436 | 1/2006 |
| KR | 10-2006-0086276 | 7/2006 |
| KR | 10-2010-0060681 | 6/2010 |
| KR | 10-2016-0108664 | 9/2016 |
| KR | 20220023489 A * | 3/2022 |

* cited by examiner

IMAGE SENSOR PACKAGE AND CAMERA DEVICE COMPRISING SAME

CROSS-REFERENCE TO RELATED PATENT APPLICATIONS

This application is a U.S. National Stage Application under 35 U.S.C. § 371 of PCT Application No. PCT/KR2021/005666, filed May 6, 2021, which claims priority to Korean Patent Application No. 10-2020-0088318, filed Jul. 16, 2020, whose entire disclosures are hereby incorporated by reference.

TECHNICAL FIELD

The present invention relates to a camera device, and more specifically, to an image sensor package and a camera device including the same.

BACKGROUND ART

A camera is a device which captures an image or moving images of a subject and is installed in portable devices, drones, vehicles, or the like. Due to a trend of a full screen, a narrow bezel, an ultra-high resolution, a multi-camera, and a zoom function of a portable device and a 5G module, a further demand for miniaturization and high performance of a camera device is required.

In general, in a camera device mounted in a portable device or the like, an image sensor may be disposed on a printed circuit board, an image sensor and the printed circuit board may be wire-bonded, an infrared (IR) filter may be disposed on the image sensor, and a lens assembly may be disposed on the IR filter.

According to the demand for the miniaturization of the camera device, it is necessary to reduce not only a distance from the printed circuit board to the IR filter, but also a size of the printed circuit board in a direction parallel to the printed circuit board.

To this end, a mold on chip (MoC) structure molded by a molding member between the printed circuit board, the image sensor, and the IR filter has been tried, but there are problems of difficulties in controlling a thickness of the molding member and aligning an optical axis of the IR filter.

Technical Problem

The present invention is directed to providing an image sensor package of a camera device capable of being implemented in a small size.

Technical Solution

One aspect of the present invention provides an image sensor package including a printed-circuit board, an image sensor disposed on the printed circuit board, a first support disposed on the image sensor, a filter layer disposed on the image sensor, a second support disposed on the printed circuit board at a side surface of the image sensor, a wire disposed between the first support and the second support and having one end connected to the image sensor and the other end connected to the printed circuit board, and a molding member filling between the first support and the second support.

The molding member may be in contact with an upper portion and a side portion of the image sensor.

The first support may be disposed outside an active area of the image sensor.

A height of the second support may be greater than a height of the first support.

The first support may include a first region having a first height based on an upper surface of the printed circuit board and one or more second regions connected to the first region and formed higher than the first height based on the upper surface of the printed circuit board.

The second support may include a third region having a third height based on an upper surface of the printed circuit board and one or more fourth regions connected to the third region and formed higher than the third height based on the upper surface of the printed circuit board.

The second support may include a third region having a third height based on the upper surface of the printed circuit board and one or more fourth regions connected to the third region and formed higher than the third height based on the upper surface of the printed circuit board, and the filter layer may be disposed to vertically overlap at least a part of the first region and the third region.

The filter layer may be disposed not to vertically overlap at least one of the one or more second regions and the one or more fourth regions.

The filter layer may be disposed to vertically overlap the one or more second regions and not vertically overlap the one or more fourth regions.

The first region and the filter layer may be spaced apart from each other by the molding member.

The image sensor package may further include at least one passive element disposed between the first support and the second support on the printed circuit board, wherein the molding member may surround the passive element.

The first support may include a first region having a first width and one or more second regions connected to the first region, and a maximum width of the one or more second regions may be greater than a maximum width of the first region.

The second support may include a third region having a third width and one or more fourth regions connected to the third region, and a maximum width of the one or more fourth regions may be greater than a maximum width of the third region.

The one or more second regions may include a plurality of second regions, and at least one of a height and a width of some of the plurality of second regions may be greater than at least one of a height and a width of the other of the plurality of second regions.

The one or more fourth regions may include a plurality of fourth regions, and at least one of a height and a width of some of the plurality of fourth regions may be greater than at least one of a height and a width of the other of the plurality of fourth regions.

An area of the filter layer may be greater than an area of an active area of the image sensor and smaller than an area of the printed circuit board.

The area of the filter layer may be smaller than the area of the printed circuit board formed by a region in which the second support is disposed.

The first support may be disposed in a quadrangular shape along an edge of the image sensor, and the second support may be disposed in a circular or oval shape on the printed circuit board.

Another aspect of the present invention provides a camera device including an image sensor package and a lens assembly disposed on the image sensor package, wherein the image sensor package includes a printed circuit board, an image sensor disposed on the printed circuit board, a first support disposed on the image sensor, a filter layer disposed on the image sensor, a second support disposed on the printed circuit board near a side surface of the image sensor, a wire disposed between the first support and the second support and having one end connected to the image sensor and the other end connected to the printed circuit board, and a molding member filling between the first support and the second support.

The printed circuit board may include a plurality of rigid regions and a flexible region connecting the plurality of rigid regions, the printed circuit board may be foldable through the flexible region, and the image sensor may be disposed on one of the plurality of rigid regions.

Advantageous Effects

According to embodiments of the present invention, a camera device, which has a simple structure, is manufactured by a simple manufacturing process, and is miniaturized, can be obtained. In particular, according to the embodiments of the present invention, a thickness and a width of an image sensor package can be greatly reduced.

MODES OF THE INVENTION

Hereinafter, exemplary embodiments of the present invention will be described in detail with reference to the accompanying drawings.

However, the technical spirit of the present invention is not limited to the few embodiments which will be described and may be implemented in a variety of different forms, and one or more components of the embodiments may be selectively combined, substituted, and used within the range of the technical spirit.

In addition, unless clearly and specifically defined otherwise by the context, all terms (including technical and scientific terms) used herein can be interpreted as having meanings generally understood by those skilled in the art, and meanings of generally used terms, such as those defined in commonly used dictionaries, will be interpreted in consideration of contextual meanings of the related art.

In addition, the terms used in the embodiments of the present invention are considered in a descriptive sense only and not to limit the present invention.

In the present specification, unless clearly indicated otherwise by the context, singular forms include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and the essence, order, and the like of the elements are not limited by the terms.

In addition, it should be understood that, when an element is referred to as being "connected" or "coupled" to another element, such a description may include both a case in which the element is directly connected or coupled to another element, and a case in which the element is connected or coupled to another element with still another element disposed therebetween.

In addition, when any one element is described as being formed or disposed "on or under" another element, such a description includes both a case in which the two elements are formed or disposed in direct contact with each other and a case in which one or more other elements are interposed between the two elements. In addition, when one element is described as being formed "on or under" another element, such a description may include a case in which the one element is formed at an upper side or a lower side with respect to another element.

Figure 1:
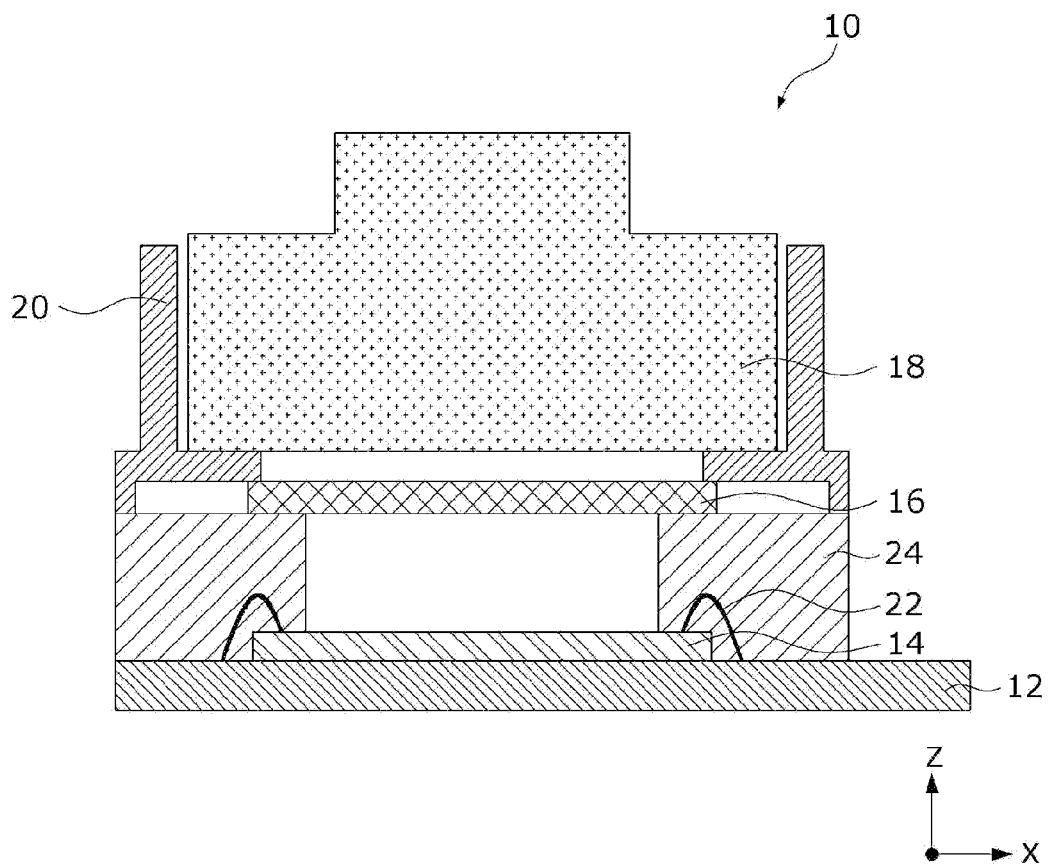
FIG. 1 is a cross-sectional view illustrating an example of a camera device.
Figure 2:
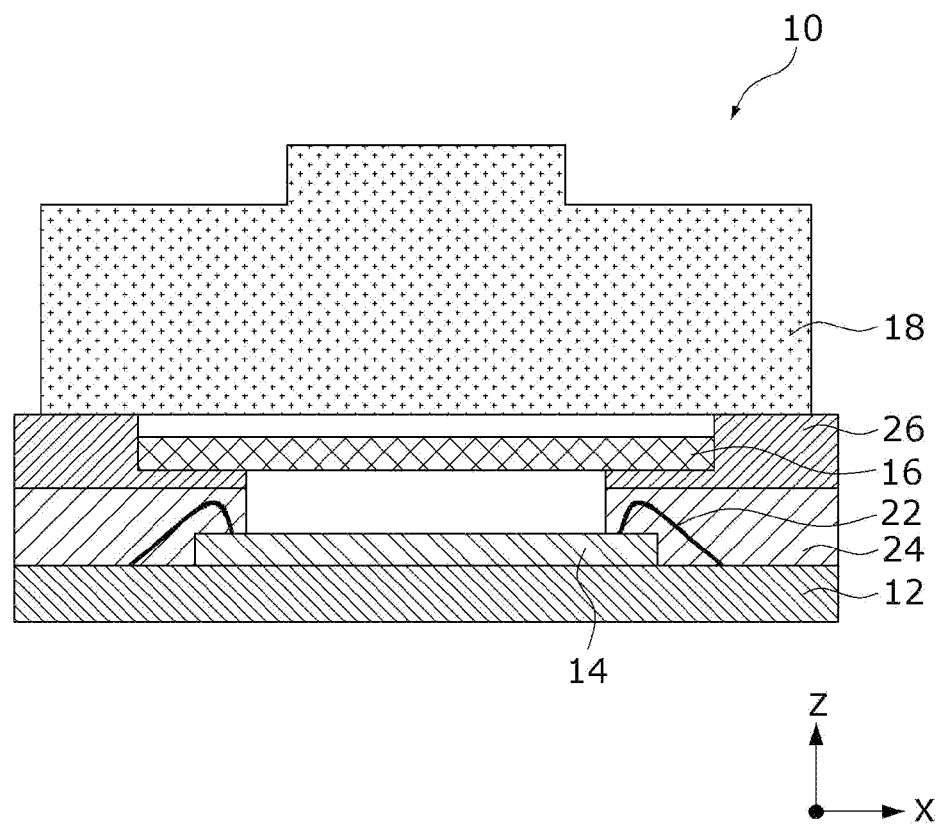
FIG. 2 is a cross-sectional view illustrating another example of a camera device.

FIG. 1 is a cross-sectional view illustrating an example of a camera device, and FIG. 2 is a cross-sectional view illustrating another example of a camera device.

Referring to FIGS. 1 to 2, a camera device 10 may include a printed circuit board (PCB) 12, an image sensor 14 disposed on the PCB 12, a filter layer 16 disposed on the image sensor 14, and a lens assembly 18 disposed on the filter layer 16. As illustrated in FIG. 1, the PCB 12, the image sensor 14, the filter layer 16, and the lens assembly 18 may be accommodated in a housing 20.

The PCB 12 may include a flexible PCB (FPCB), a rigid FPCB (RFPCB), or a ceramic PCB.

The image sensor 14 may be disposed on the PCB 12, and wires 22 may be bonded to the image sensor 14 and the PCB 12. The image sensor 14 generates an image signal by collecting incident light, and a semiconductor device used in the image sensor 14 may be formed of a charged coupled device (CCD) sensor or a complementary metal-oxide semiconductor (CMOS) sensor and may be a semiconductor device which captures an image of a person or object and outputs an electrical signal.

The image sensor 14 may include a plurality of pixels arranged in a matrix form. Each pixel may include a photoelectric conversion element and at least one transistor for sequentially outputting a voltage level of the photoelectric conversion device. An area in which the plurality of pixels are disposed may be an active area of the image sensor 14. The active area of the image sensor 14 may be interchangeably used with a light receiving part.

The filter layer 16 may be implemented as a glass substrate, and the glass substrate may be a transparent or translucent substrate formed of a glass material. The filter layer 16 may limit or transmit light of a predetermined wavelength. For example, the filter layer 16 may block infrared (IR) rays. To this end, a treatment for IR blocking may be performed on the glass substrate 16. For example, an IR blocking film may be disposed on at least one of two surfaces of the glass substrate 16.

The lens assembly 18 may include at least one lens, have a predetermined field of view and a focal length, refract incident light, and transmit the incident light to the image sensor 14. The lens assembly 18 may be moved by an actuator (not shown). When the lens assembly 18 includes a plurality of lenses, each lens may be aligned with a central axis to form an optical system. In this case, the central axis may be the same as an optical axis of the optical system. The lens assembly 18 may have a fixed focal length lens or a variable lens of which a focal point is adjustable.

In order to maintain a predetermined distance between the filter layer 16 and the image sensor 14 and stably support the filter layer 16, a molding member 24 may be disposed between the PCB 12, the image sensor 14, and the filter layer 16. The molding member 24 may mold the wires 22 bonded to the image sensor 14 and the PCB 12. Accordingly, not only a thickness but also a width of the image sensor package 10 may be reduced, and the wire 22 may be stably fixed compared to a chip on board (COB) structure.

However, it may not be easy to uniformly control a thickness of the molding member 24, and accordingly, it may be difficult to align the optical axis of the filter layer 16 disposed on the molding member 24.

In order to solve this problem, as illustrated in FIG. 2, a separate mechanism 26 may be disposed between a molding member 24 and a filter layer 16, and the filter layer 16 may be disposed on the separate mechanism 26. However, there may be a problem that a size is increased and an assembly process is added due to the separate mechanism 26.

An embodiment of the present invention intends to provide a structure of an image sensor package in which an overall size of a camera device is minimized and an assembly process is simplified.

In the present specification, for the sake of convenience of description, a direction Z toward a filter layer from a PCB may be referred to as a thickness direction of an image sensor package, and a direction X perpendicular to the thickness direction of the image sensor package, that is, a direction parallel to the PCB, may be referred to as a width direction or a lateral direction.

Hereinafter, redundant descriptions for contents related to the PCB, the image sensor, the filter layer, the wires, the molding member, and the like which have been described with reference to FIGS. 1 and 2 will be omitted. The contents of the components, such as the lens assembly, the housing, and the like, described with reference to FIGS. 1 to 2 may be applied to descriptions of components excluding an image sensor package in a camera device according to an embodiment of the present invention.

Figure 3:
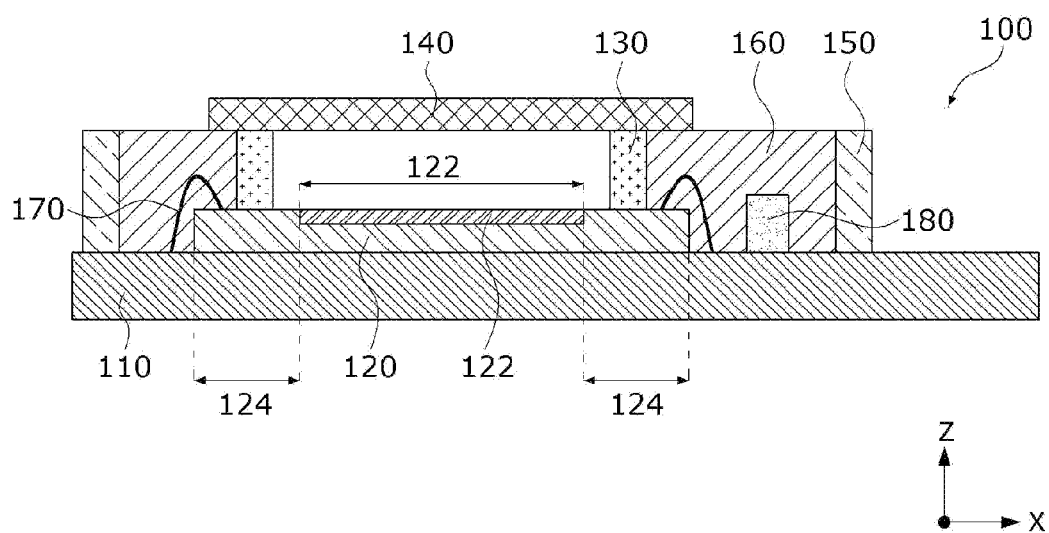
FIG. 3 is a cross-sectional view illustrating an image sensor package according to one embodiment of the present invention.
Figure 4:
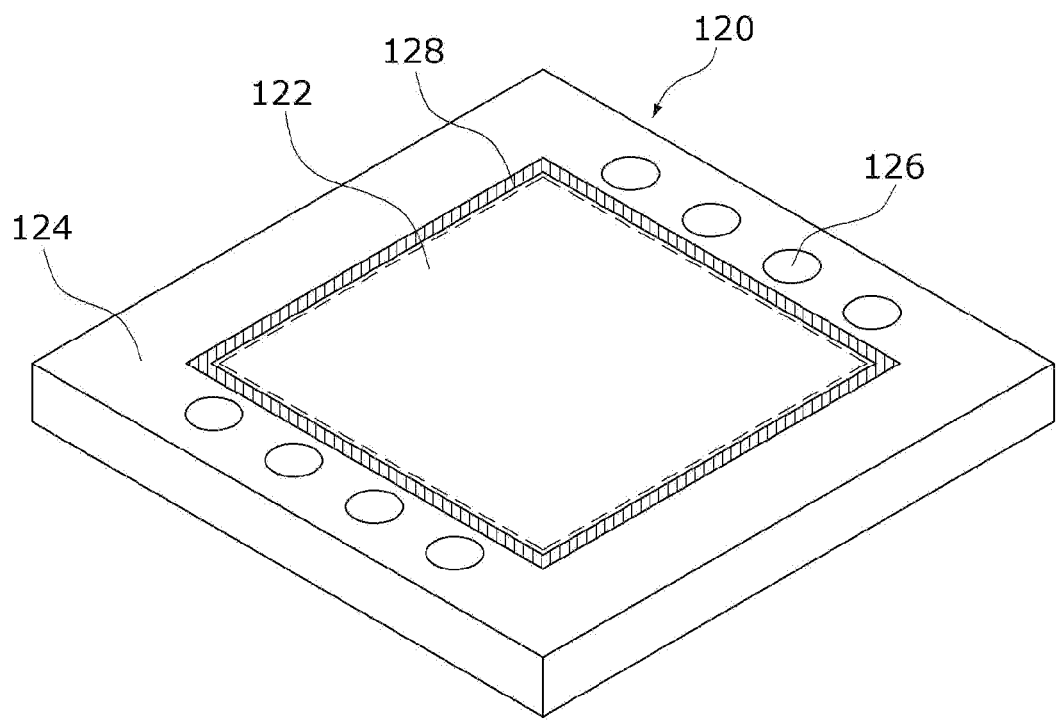
FIG. 4 is a perspective view illustrating the image sensor according to one embodiment of the present invention.

FIG. 3 is a cross-sectional view illustrating an image sensor package according to one embodiment of the present invention and FIG. 4 is a perspective view illustrating the image sensor according to one embodiment of the present invention.

Referring to FIG. 3, an image sensor package 100 according to the embodiment of the present invention includes a PCB 110, an image sensor 120 disposed on the PCB 110, a first support 130 disposed on the image sensor 120, a filter layer 140 disposed on the image sensor 120, a second support 150 disposed on the PCB 110 near a side surface of the image sensor 120, a molding member 160 filling between the first support 130 and the second support 150, and wires 170 which are disposed between the first support 130 and the second support 150 and each has one end disposed on the image sensor 120 and the other end connected to the printed circuit board 110.

When the molding member 160 fills between the first support 130 and the second support 150, an amount and a thickness of the molding member 160 may be easily controlled, accordingly, the filter layer 140 may be disposed parallel to the image sensor 120 and the lens assembly (not shown), and thus an optical axis of the filter layer 140 may be precisely aligned therewith.

In this case, the molding member 160 may be in contact with an upper portion and a side portion of the image sensor 120. That is, when the molding member 160 fills between the first support 130 disposed on the image sensor 120 and the second support 150 disposed on the PCB 110 near the side surface of the image sensor 120, the molding member 160 may be in contact with an upper edge and the side portion of the image sensor 120, and thus, the image sensor 120 may be stably fixed onto the printed circuit board 110.

In this case, the wires 170 may be molded by the molding member 160. Accordingly, the wires 170 may be molded to the molding member 160 to be protected from external moisture, pollutants, or the like and stably fixed to the PCB 110 and the image sensor 120.

In addition, a passive element 180 may be further disposed on the PCB 110 between the first support 130 and the second support 150, and the passive element 180 may be molded by the molding member 160. That is, the molding member 160 may surround the passive element 180. Accordingly, since there is no need to provide a separate space for arranging the passive element 180, a size can be reduced in the width direction of the image sensor package 100, and the passive element 180 can be protected from external moisture, pollutants, or the like.

In this case, the molding member 160 may be formed of a resin composition. For example, the resin composition may include at least one of an epoxy-based resin and a silicone-based resin and an inorganic filler, and the inorganic filler may be aluminum oxide, aluminum nitride, boron nitride, silicon carbide, carbon nanotubes, graphite, and the like but is not limited thereto. Accordingly, heat generated by the image sensor 120, the wire 170, and the passive element 180 may be easily radiated to the outside after being transmitted to the PCB 110 through the molding member 160.

Meanwhile, referring to FIG. 4, the image sensor 120 includes an active area 122 and a non-active area 124 surrounding the active area 122. As described above, the active area 122 of the image sensor 120 is a light receiving part in which a plurality of pixels are disposed, and a pad 126 for wire-bonding may be formed in the non-active area 124. The first support 130 according to the embodiment of the present invention may be disposed outside the active area 122, that is, along an area 128 between an edge of the active area 122 and the pad 126.

Accordingly, the molding member 160 may prevent external moisture, pollutants, or the like from penetrating into the active area 122 of the image sensor 120.

Figure 5:
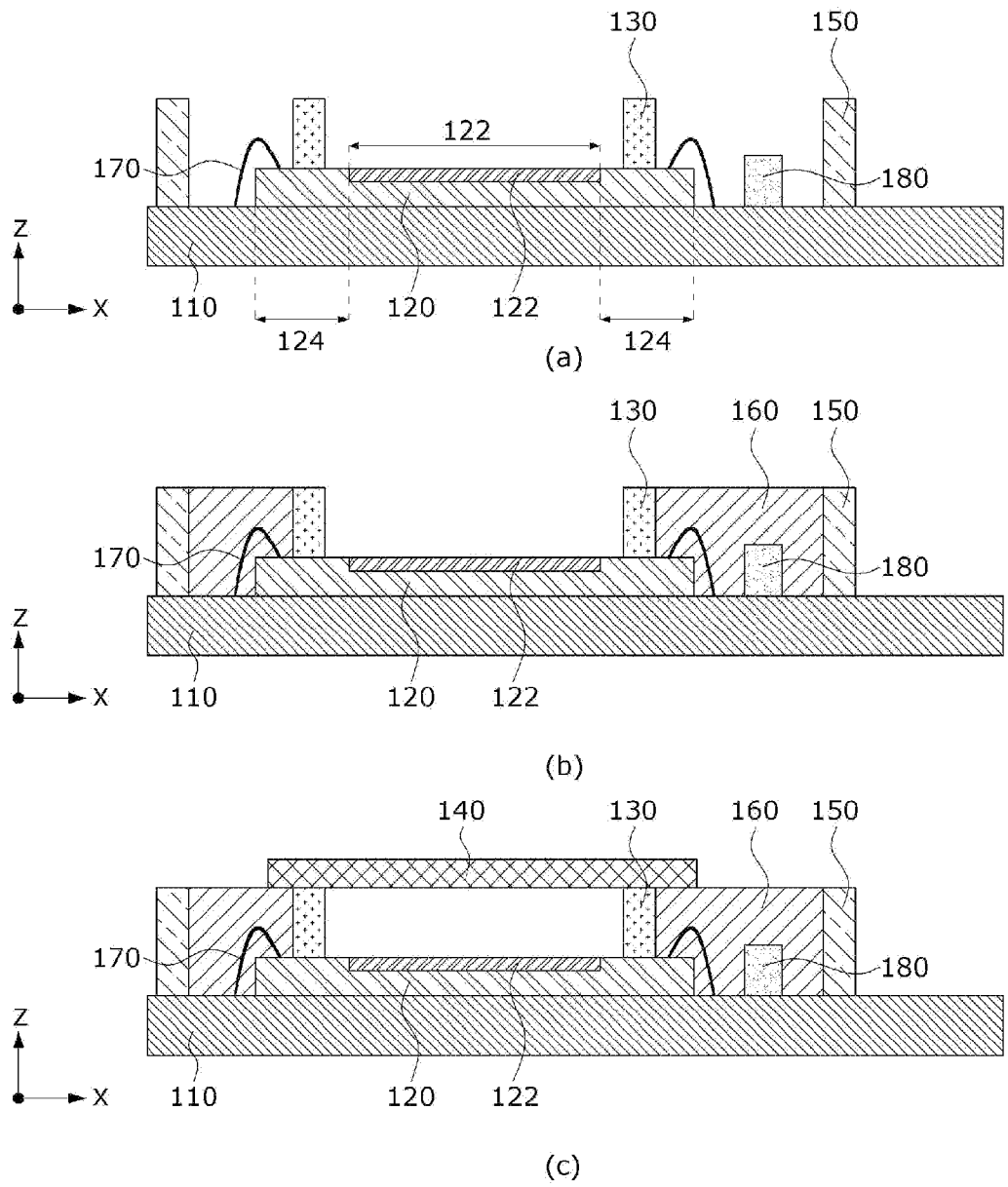
FIGS. 5A to 5C are cross-sectional views showing an assembly process of the image sensor package according to one embodiment of the present invention.
Figure 6:
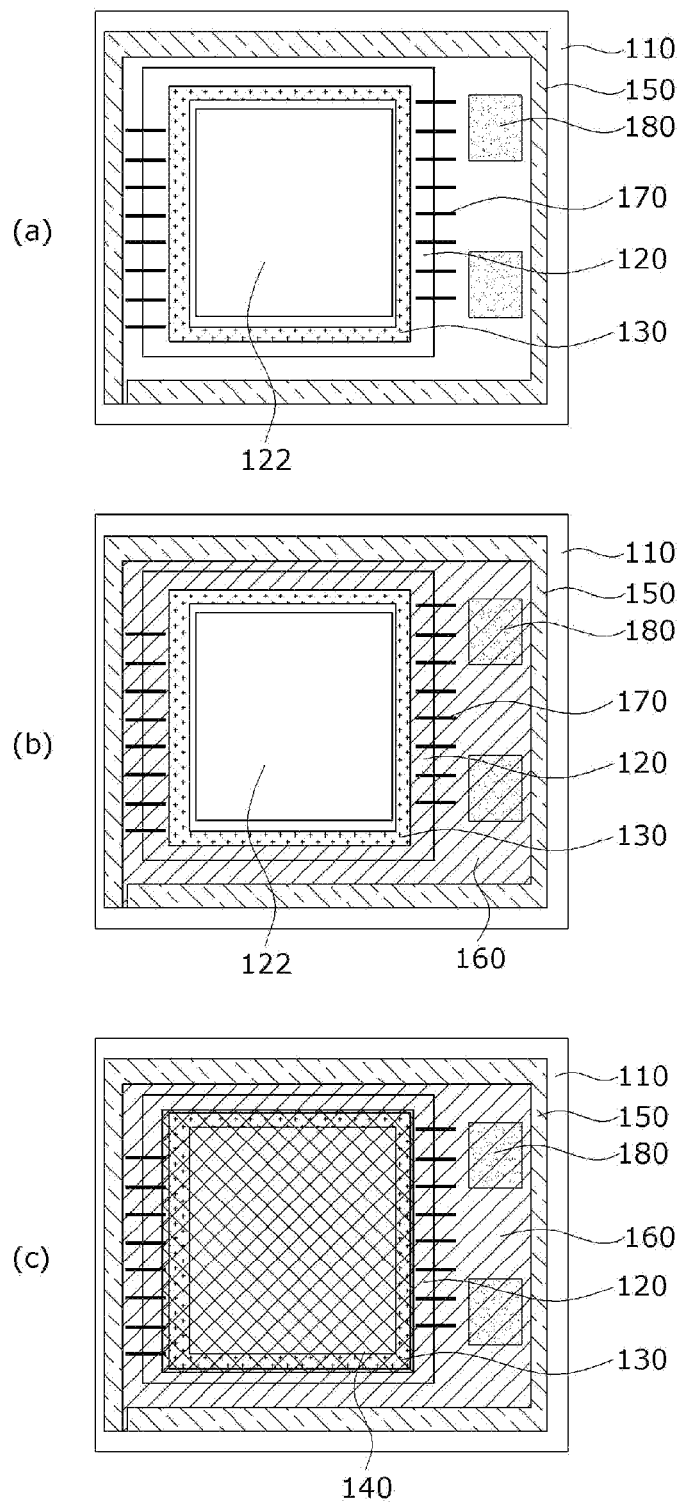
FIGS. 6A to 6C are top views showing the assembly process of the image sensor package according to the embodiment of the present invention.

FIGS. 5A to 5C are cross-sectional views showing an assembly process of the image sensor package according to one embodiment of the present invention, and FIGS. 6A to 6C are top views showing the assembly process of the image sensor package according to the embodiment of the present invention.

Referring to FIGS. 5A and 6A, the image sensor 120 is disposed on the PCB 110, the PCB 110 and the image sensor 120 are connected by the wires 170, the passive element 180 is disposed on the PCB 110, and the first support 130 and the second support 150 are disposed. As described above, the first support 130 may be disposed on the non-active area 124 of the image sensor 120, and the second support 150 may be disposed on the PCB 110. In this case, each of the first support 130 and the second support 150 may include at least one resin among, for example, epoxy-based resins and silicone-based resins. Accordingly, the first support 130 and the second support 150 may be easily molded while a height, a width, and a shape of each of the first support 130 and the second support 150 are controlled, and a stable structure thereof can be maintained after curing.

Referring to FIGS. 5B and 6B, the molding member 160 is molded between the first support 130 and the second support 150. Accordingly, the wires 170 and the passive element 180 between the first support 130 and the second support 150 may be molded by the molding member 160. In this case, the molding member 160 may be formed of a resin composition. For example, the resin composition may include at least one of an epoxy-based resin and a silicone-based resin and the inorganic filler, and the inorganic filler may be aluminum oxide, aluminum nitride, boron nitride, silicon carbide, carbon nanotubes, graphite, and the like but is not limited thereto. When the molding member 160 fills between the first support 130 and the second support 150, it is easy to control a height and an amount of the molding member 160.

Referring to FIGS. 5C and 6C, the filter layer 140 is disposed on the first support 130 and the molding member 160. Accordingly, since the image sensor 120, the filter layer 140, and the lens assembly (not shown) may be disposed in parallel, the optical axis of the filter layer 140 can be precisely aligned.

Figure 7:
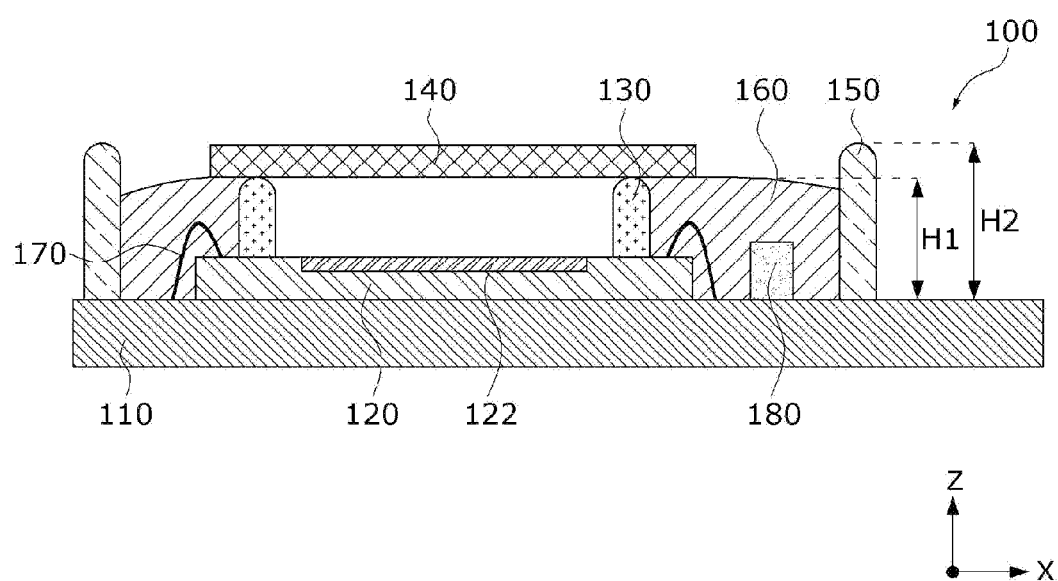
FIG. 7 is a cross-sectional view illustrating an image sensor package according to another embodiment of the present invention.
Figure 8:
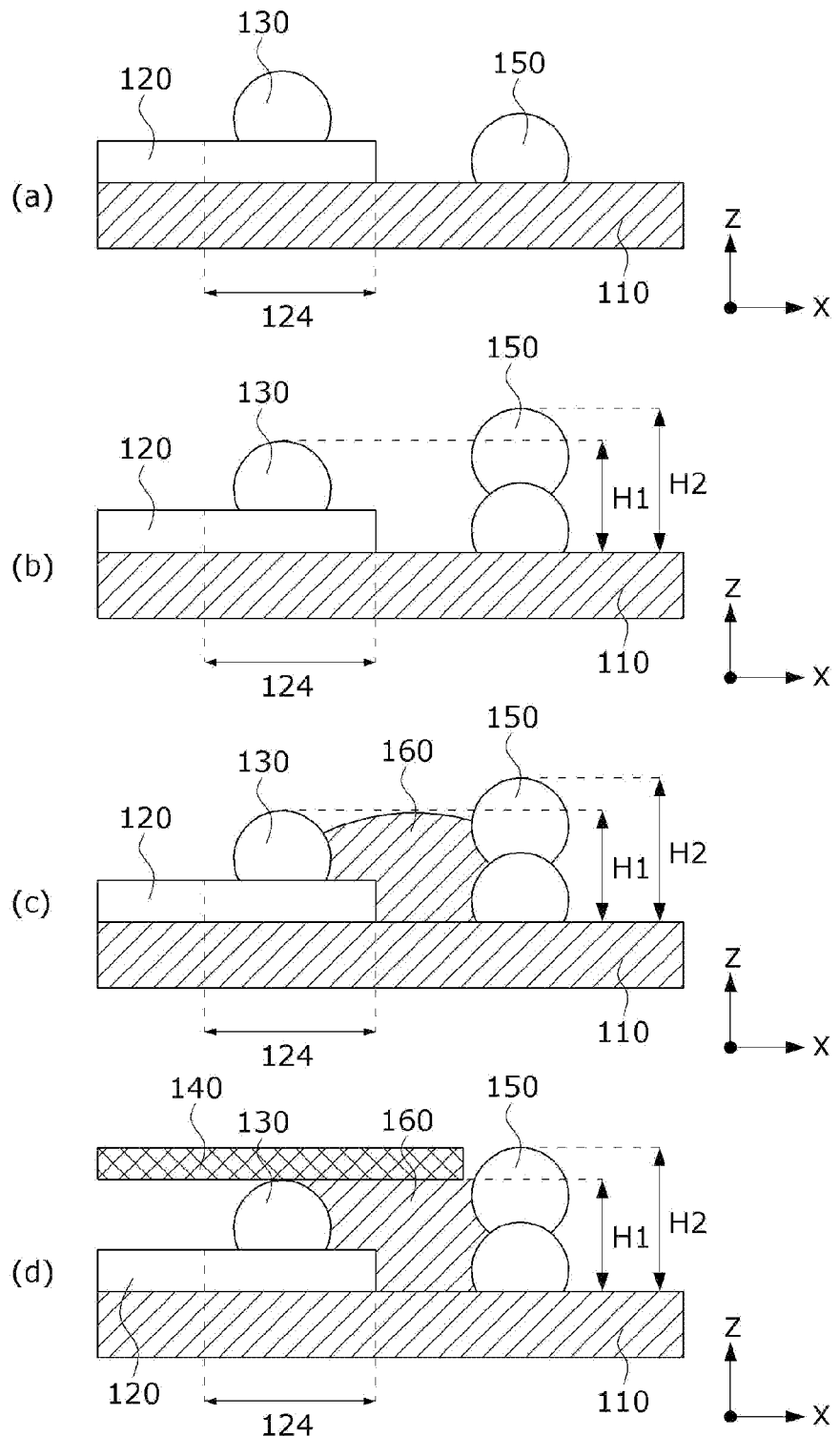
FIGS. 8A to 8D are cross-sectional views showing a process of forming a first support, a second support, and a molding member and arranging a filter layer to form the image sensor package of FIG. 7.

FIG. 7 is a cross-sectional view illustrating an image sensor package according to another embodiment of the present invention, and FIGS. 8A to 8D are cross-sectional views showing a process of forming a first support, a second support, and a molding member and arranging a filter layer to form the image sensor package of FIG. 7. The same contents as the contents described with reference to FIGS. 1 to 6 will be omitted.

Referring to FIG. 7, a height H2 of a second support 150 may be greater than a height H1 of a first support 130. In this case, each of the height H1 of the first support 130 and the height H2 of the second support 150 may be a height based on one surface of a printed circuit board 110. As described above, when the height H2 of the second support 150 is greater than the height H1 of the first support 130, a molding member 160 may prevent a problem of flowing over the second support 150, and thus it is easy to control an amount and the height of the molding member 160, and since there is no need to arrange a separate housing on a side surface of an image sensor 120, a size of an image sensor package 100 in a width direction may be reduced while protecting the image sensor 120.

In this case, the height H2 of the second support 150 may be 1.05 to 2 times, preferably 1.1 to 1.7 times, and more preferably 1.2 to 1.5 times the height H1 of the first support 130. When the height H2 of the second support 150 is smaller than the numerical range, the molding member 160 may flow over the second support 150, and when the height H2 of the second support 150 is greater than the value, it is difficult to mold the second support 150, and a size of a filter layer 140 can be restricted.

In this case, the first support 130 and the second support 150 may be formed by a method of discharging a resin using a dispenser and then curing the resin.

Referring to FIG. 8A, the resin may be discharged on a non-active area 124 of the image sensor 120 to form the first support 130, and the resin may be discharged on the PCB 110 to form the second support 150 so that the second support 150 is spaced a predetermined distance from the first support 130. In this case, since the image sensor 120 is disposed on the PCB 110, a height of the resin discharged to form the first support 130 may be greater than a height of the resin discharged to form the second support 150.

Referring to FIG. 8B, the resin discharged to form the second support 150 is discharged once more on the resin discharged to form the second support 150. Accordingly, the height H2 of the second support 150 may be 1.05 to 2 times, preferably 1.1 to 1.7 times, and more preferably 1.2 to 1.5 times the height H1 of the first support 130.

Then, referring to FIG. 8C, the molding member 160 fills between the first support 130 and the second support 150. Accordingly, the height of the molding member 160 may be formed to be smaller than the height of the second support 150.

Then, referring to FIG. 8D, the filter layer 140 is disposed. The filter layer 140 may be disposed on the first support 130 and the molding member 160. According to the embodiment of the present invention, since the height of the first support 130 and the height of the molding member 160 may be controlled, the filter layer 140 may be disposed parallel to the image sensor 120.

Figure 9:
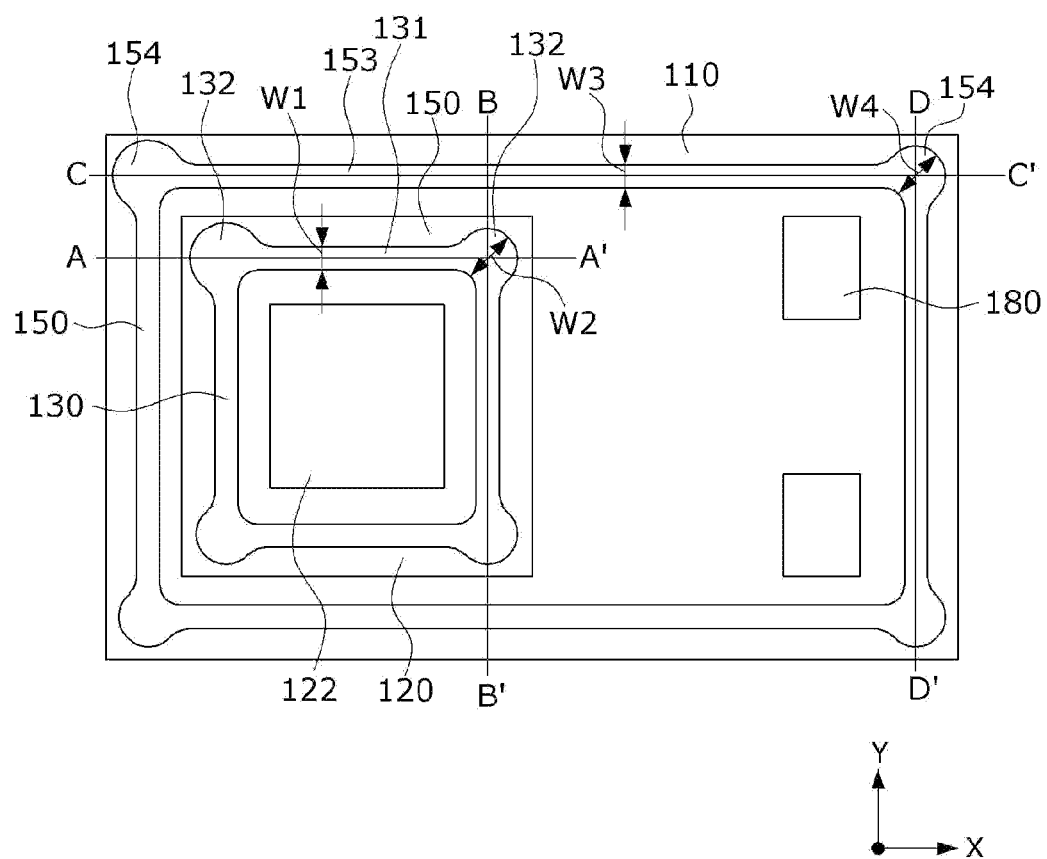
FIG. 9 is a top view illustrating the first support and the second support formed according to FIGS. 8A to 8C.
Figure 10:
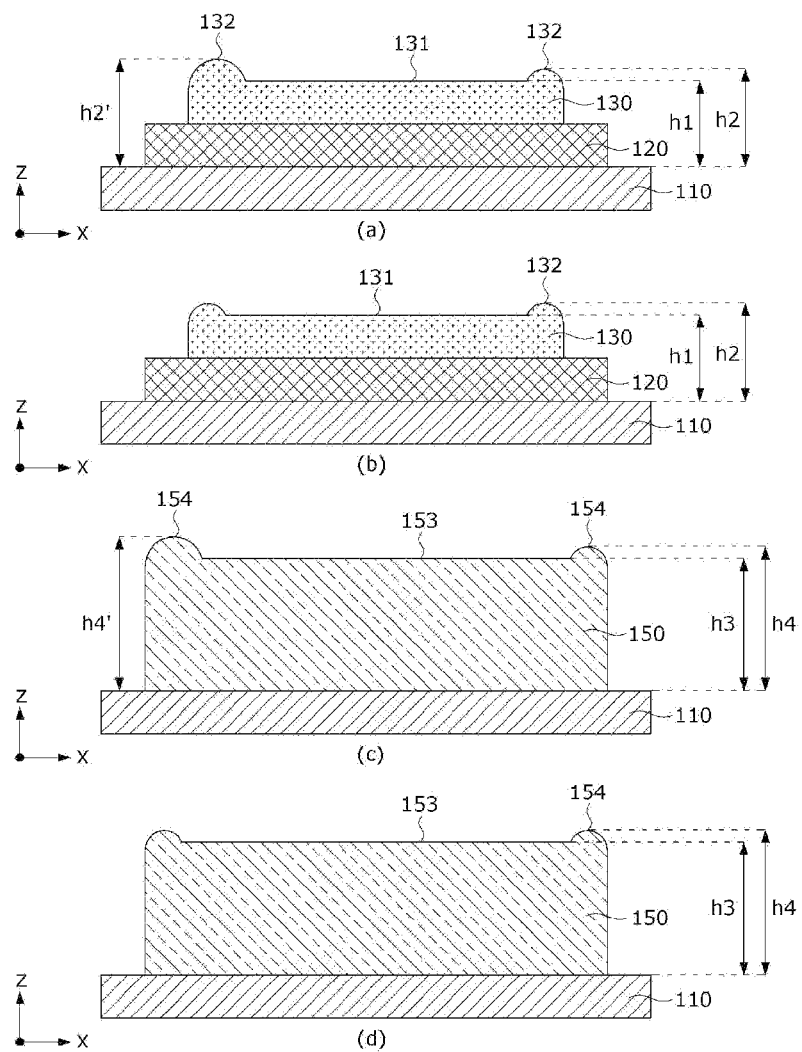
FIG. 10A is a cross-sectional view illustrating the first support along line A-A' of FIG. 9.
FIG. 10B is a cross-sectional view illustrating the first support along line B-B' of FIG. 9.
FIG. 10C is a cross-sectional view illustrating the second support along line C-C' of FIG. 9.
FIG. 10D is a cross-sectional view illustrating the second support along line D-D' of FIG. 9.

FIG. 9 is a top view illustrating the first support and the second support formed according to FIGS. 8A to 8C. FIG. 10A is a cross-sectional view illustrating the first support along line A-A' of FIG. 9, FIG. 10B is a cross-sectional view illustrating the first support along line B-B' of FIG. 9, FIG. 10C is a cross-sectional view illustrating the second support along line C-C' of FIG. 9, and FIG. 10D is a cross-sectional view illustrating the second support along line D-D' of FIG. 9.

Referring to FIGS. 9 and 10A to 10D, the first support 130 may include a first region 131 having a first height h1 based on an upper surface of the PCB 110 and a second region 132 which is connected to the first region 131 and formed to have a second height h2 greater than the first height h1 based on an upper surface of the image sensor 120. The second region 132 may be provided as one second region 132 or may be provided as a plurality second regions 132. That is, the first support 130 may include at least one second region 132. In the embodiment, the second region 132 is described as being formed at each of all four corners for the sake of convenience of description but is not limited thereto. The first support 130 may also include only one second region 132. The second support 150 may include a third region 153 having a third height h3 based on the upper surface of the PCB 110 and a fourth region which is connected to the third region 153 and formed to have a fourth height h4 greater than the third height h3 based on the upper surface of the PCB 110. The fourth region 154 may be provided as one fourth region 154 or may be provided as a plurality fourth regions 154. That is, the second support 150 may include at least one fourth region 154. In the embodiment, the fourth region 154 is described as being formed at each of all four corners for the sake of convenience of description but is not limited thereto. The second support 150 may also include only one fourth region 154. In this case, the second height h2 may be 1.02 to 1.2 times, preferably 1.05 to 1.15 times, and more preferably 1.07 to 1.13 times the first height h1. For example, the first height h1 may be in the range of 250 to 350 μm, preferably 270 to 330 μm, and more preferably 285 to 315 μm. Similarly, the fourth height h4 may be 1.02 to 1.2 times, preferably 1.05 to 1.15 times, and more preferably 1.07 to 1.13 times the third height h3.

In this case, a width w2 of at least one second region 132 may be greater than a width w1 of the first region 131, and a width w4 of at least one fourth region 154 may be greater than a width w3 of the third region 153. In this case, the widths w1, w2, w3, and w4 may be widths, for example, maximum widths, in a direction parallel to the PCB 110 or the image sensor 120.

In this case, the first region 131 and the third region 153 may be straight regions, and the second region 132 and the fourth region 134 may be corner regions of the supports. Accordingly, a strength of the corner region of each of the supports may be increased.

In addition, at least one of the height or the width of the second region 132 may be greater than at least one of the height or the width of the first region 131.

In addition, at least one of the height or the width of the fourth region 154 may be greater than at least one of the height or the width of the third region 153.

To this end, as described with reference to FIGS. 8A and 8B, when each of the first support 130 and the second support 150 is formed by discharging the resin, each of the first support 130 and the second support 150 may be formed by sequentially discharging the resin. Accordingly, each of the first support 130 and the second support 150 may have the greater height at a position, at which a resin discharged direction is changed or a resin discharge start point meets a resin discharge end point, than the straight region.

Meanwhile, as illustrated in FIGS. 10A and 10C, at least one of a height h2' and a width of a part of the plurality of second regions 132 may be greater than at least one of a height h2 and a width of another part of the plurality of second regions 132, and at least one of a height h4' and a width of a part of the plurality of fourth regions 154 may be greater than at least one of a height h4 and a width of another part of the plurality of fourth regions 134. This may be a reference point for an arrangement of the filter layer 140, and may be formed at the position at which the discharge start point and the discharge end point of the resin meet.

Figure 11:
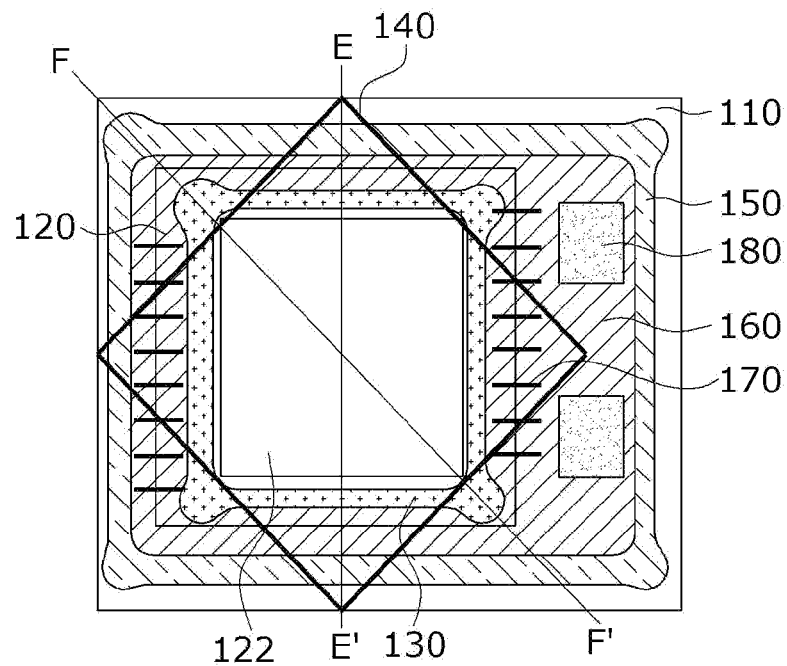
FIG. 11 is a top view illustrating an image sensor package according to one embodiment of the present invention.
Figure 12:
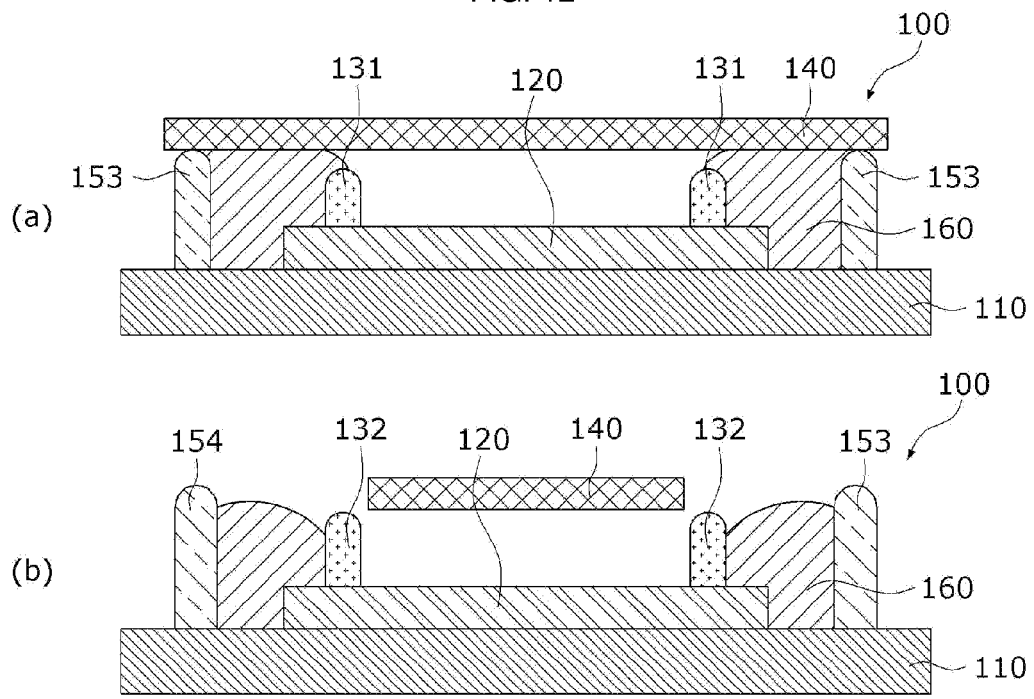
FIG. 12A is a cross-sectional view along line E-E' of FIG. 11.
FIG. 12B is a cross-sectional view along line F-F' of FIG. 11.
Figure 13:
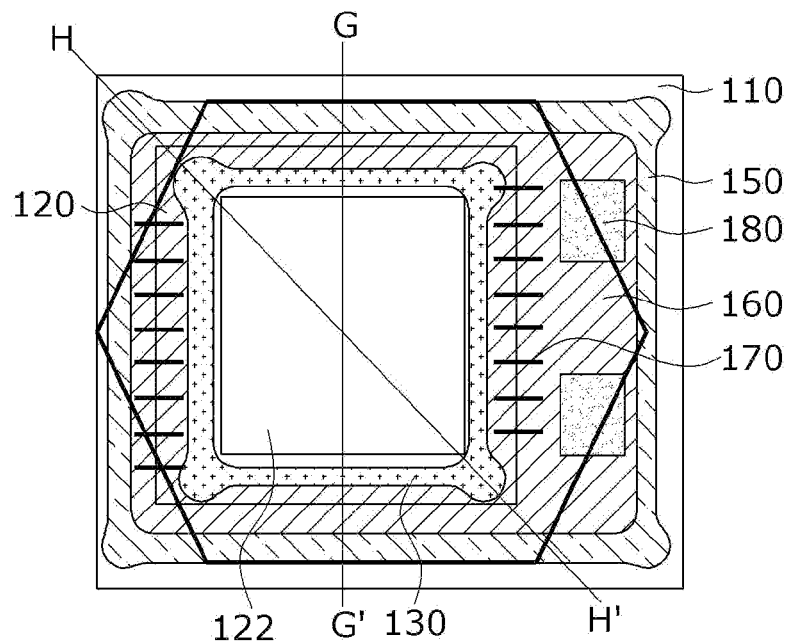
FIG. 13 is a top view illustrating an image sensor package according to another embodiment of the present invention.
Figure 14:
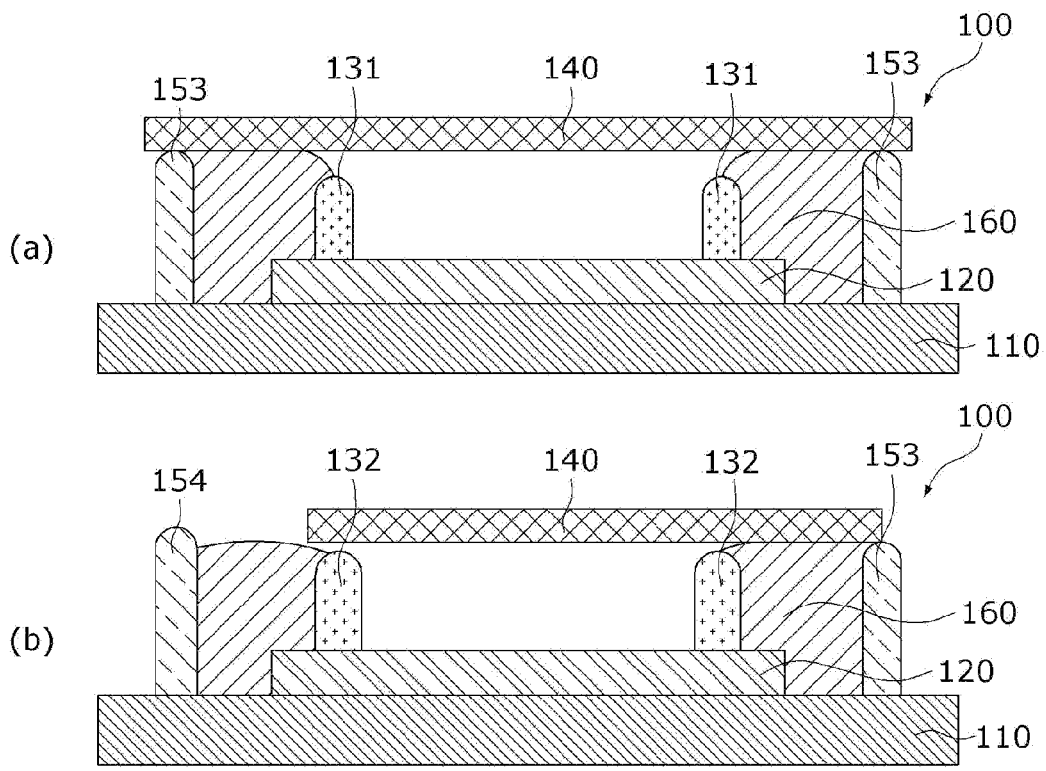
FIG. 14A is a cross-sectional view along line G-G' of FIG. 13.
FIG. 14B is a cross-sectional view along line H-H' of FIG. 13.

FIG. 11 is a top view illustrating an image sensor package according to one embodiment of the present invention, FIG. 12A is a cross-sectional view along line E-E' of FIG. 11, and FIG. 12B is a cross-sectional view along line F-F' of FIG. 11. FIG. 13 is a top view illustrating an image sensor package according to another embodiment of the present invention, FIG. 14A is a cross-sectional view along line G-G' of FIG. 13, and FIG. 14B is a cross-sectional view along line H-H' of FIG. 13.

Referring to FIGS. 11, 12A, 12B, 13, 14A, and 14B, an image sensor 120 is disposed on a PCB 110, a first support 130 is disposed on the image sensor 120, a second support 150 is disposed on the PCB 110, and a filter layer 140 is disposed on the image sensor 110. In this case, an area of the filter layer 140 may be greater than an area of an active area 122 of the image sensor 120.

As described with reference to FIGS. 9 and 10A to 10D, the first support 130 may include a first region 131 and a second region 132 in which at least one of a height and a width of the first region 131 is different from that of the second region 132, and the second support 150 may include a third region 153 and a fourth region 154 in which at least one of a height and a width of the third region 153 is different from that of the fourth region 154.

Referring to FIGS. 11, 12A, and 12B, the filter layer 140 is disposed above the image sensor 120 to vertically overlap at least a part of the first region 131 of the first support 130 and at least a part of the third region 153 of the second support 150 and not vertically overlap the second region 132 of the first support 130 and the fourth region 154 of the second support 150.

In this case, the filter layer 140 may be disposed to be spaced a predetermined distance from the first region 131, of which a height is smaller than a height of the third region 153, with a molding member 160 interposed therebetween. Accordingly, since the filter layer 140 may be disposed parallel to the image sensor 120 and a lens assembly (not shown), an optical axis passing through the filter layer 140 can be precisely aligned.

In this case, at least a part of the second region 132 and at lease a part of the fourth region 154 may be disposed near a side surface of the filter layer 140. Accordingly, since the first region 131 and the third region 153 are disposed under the filter layer 140, and at least a part of the second region 132 and at least a part of the fourth region 154 are disposed near the side surface of the filter layer 140, the filter layer 140 may be stably supported, and the filter layer 140 may be prevented from being twisted not only in a thickness direction but also in a width direction.

Referring to FIGS. 13, 14A, and 14B, a filter layer 140 may be disposed above the image sensor 120 to vertically overlap at least a part of the first region 131 of the first support 130 and at least a part of the third region 153 of the second support 150, vertically overlap the second region 130 of the first support 130, and not vertically overlap the fourth region 154 of the second support 150.

To this end, the filter layer 140 may have a shape such as a polygonal shape, for example, a hexagonal shape or an octagonal shape, rather than a quadrangular shape. When the filter layer 140 has the hexagonal shape or the octagonal shape rather than the quadrangular shape, the filter layer 140 may be disposed more widely than the case of the quadrangular shape.

In this case, the filter layer 140 may be disposed to be spaced a predetermined distance from the first region 131, of which a height is smaller than a height of the third region 153, with the molding member 160 interposed therebetween.

When the height of the third region of the second support 150 is greater than a height of the second region 132 of the first support 130, the filter layer 140 may be disposed to be spaced a predetermined distance from the second region 132 with the molding member 160 interposed therebetween. Accordingly, since the filter layer 140 may be disposed parallel to the image sensor 120 and the lens assembly (not shown), an optical axis passing through the filter layer 140 may be precisely aligned therewith.

In this case, at least a part of the fourth region 154 may be disposed near the side surface of the filter layer 140. Accordingly, since the first region 131, the second region 132, and the third region 153 are disposed under the filter layer 140, and at least a part of the fourth region 154 is disposed near the side surface of the filter layer 140, the filter layer 140 may be stably supported, and the filter layer may be prevented from being twisted not only in a thickness direction but also in a width direction.

In the above description, an example of both the first support 130 and the second support 150 each of which is formed in a quadrangular shape along an edge of the image sensor 120 and an edge of the printed circuit board 110 has been illustrated, but the present invention is not limited thereto.

Figure 15:
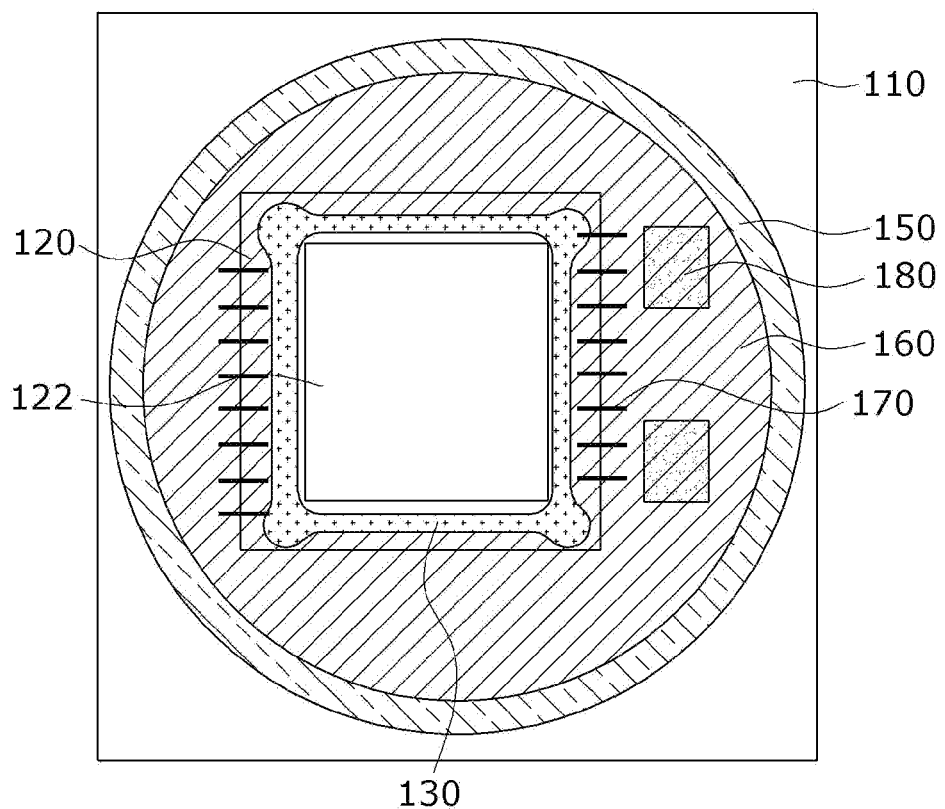
FIG. 15 is a view illustrating a shape of a first support and a shape of the second support according to still another embodiment of the present invention.

FIG. 15 is a view illustrating a shape of a first support and a shape of a second support according to still another embodiment of the present invention.

Referring to FIG. 15, an image sensor 120 is disposed on a PCB 110, a first support 130 is disposed on the image sensor 120, and a second support 150 is disposed on the PCB 110. The first support 130 may be formed in a quadrangular shape along an edge of the image sensor 120, and the second support 150 may be formed in a circular or oval shape. When the first support 130 is formed in the quadrangular shape along the edge of the image sensor 110, an area of an active area 122 of the image sensor 120 may be maximized, and when the second support 150 is formed in the circular or oval shape, the number of inflection points of resin discharge can be minimized to uniformly maintain a height of the second support 150 except for a point at which a resin discharge start and a resin discharge end point meet. Accordingly, an area of the filter layer 140 can be maximized.

In addition, although not illustrated in the drawing, the second support 150 may include a third region having a third height based on an upper surface of the PCB 110 and a fourth region which is connected to the third region and formed to have a fourth height greater than the third height based on the upper surface of the PCB 110. The fourth region may be provided as one fourth region or may be provided as a plurality of fourth regions. That is, the second support 150 may include at least one fourth region.

Meanwhile, in the above embodiments, an example of the PCB 110, which is a single-layered rigid substrate, has been described, but the present invention is not limited thereto, and the PCB 110 of an image sensor package 100 according to the embodiment of the present invention may be an RFPCB.

Figure 16:
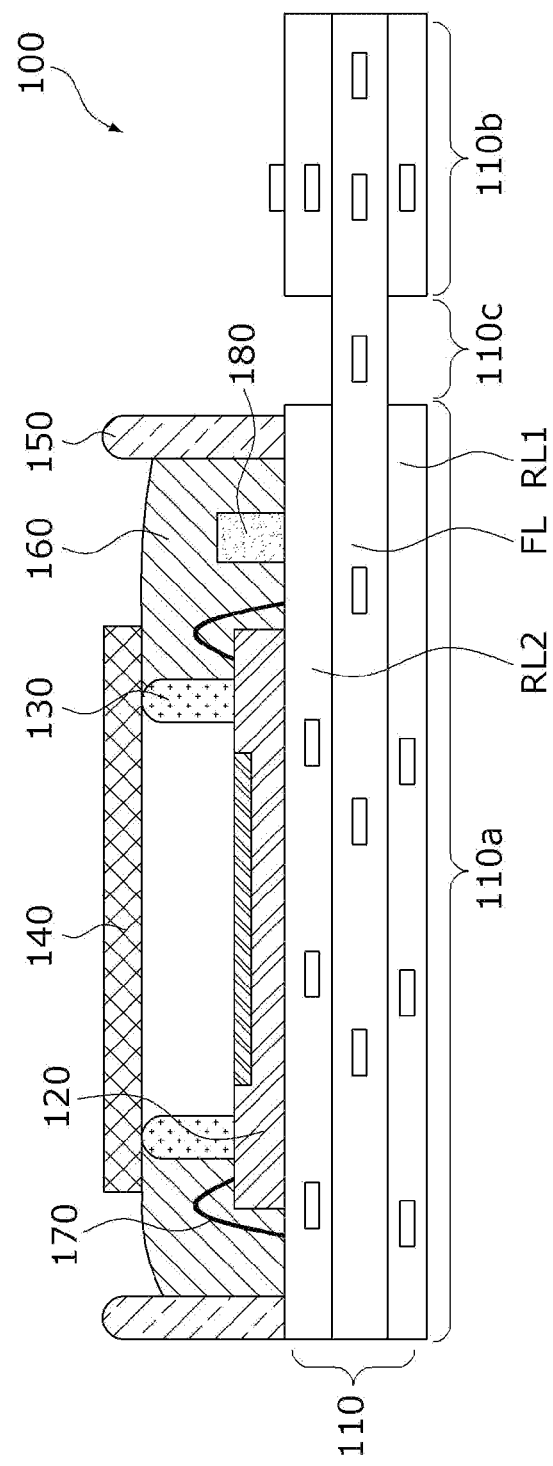
FIG. 16 is a cross-sectional view illustrating a part of an image sensor package according to still another embodiment of the present invention.

FIG. 16 is a cross-sectional view illustrating a part of an image sensor package according to still another embodiment of the present invention. The same contents as the contents described with reference to FIGS. 1 to 15 will be omitted.

Referring to FIG. 16, a PCB 110 may be an RFPCB including rigid regions 110a and 110b and a flexible region 110c. In this case, an image sensor 120, a filter layer 140, and a lens assembly (not shown) are disposed in the rigid region 110a, other components, for example, a terminal, may be disposed in the other rigid region 110b, and the flexible region 110c may be disposed between one rigid region 110a and the other rigid region 110b.

In this case, each of the rigid regions 110a and 110b may include a rigid layer 1 RL1, a flexible layer FL disposed on the rigid layer 1 RL1, and a rigid layer 2 RL2 disposed on the flexible layer FL, and the flexible region 110c may be connected to the flexible layer FL of each of the rigid regions 110a and 110b.

Accordingly, the PCB 110 may be folded through the flexible region 110c between the rigid regions 110a and 110b, and a camera device 10 may be accommodated in a folded state in a small area.

The camera device according to the embodiment of the present invention may include an image sensor package according to the embodiment of the present invention described above. The camera device of the present invention may include the image sensor package and a lens assembly according to the embodiment of the present invention and may be accommodated in a housing.

While the present invention has been described above with reference to exemplary embodiments, it may be understood by those skilled in the art that various modifications and changes of the present invention may be made within a range without departing from the spirit and scope of the present invention defined by the appended claims.

The invention claimed is:

1. An image sensor package comprising:
   a printed circuit board;
   an image sensor disposed on the printed circuit board;
   a first support disposed on the image sensor;
   a filter layer disposed on the image sensor;
   a second support disposed on the printed circuit board at a side surface of the image sensor;
   a wire disposed between the first support and the second support and having one end connected to the image sensor and the other end connected to the printed circuit board; and
   a molding member filling between the first support and the second support,
   wherein a lower surface of the filter layer is in contact with the molding member and at least one of the first support and the second support,
   wherein the first support includes a first region having a first height based on an upper surface of the printed circuit board, and one or more second regions connected to the first region and formed higher than the first height based on the upper surface of the printed circuit board,
   wherein the second support includes a third region having a third height based on the upper surface of the printed circuit board and one or more fourth regions connected to the third region and formed higher than the third height based on the upper surface of the printed circuit board, and
   wherein the filter layer is disposed to vertically overlap at least a part of the first region and the third region.

2. The image sensor package of claim 1, wherein the molding member is in contact with an upper portion and a side portion of the image sensor.

3. The image sensor package of claim 1, wherein the first support is disposed outside an active area of the image sensor.

4. The image sensor package of claim 3, wherein a height of the second support is greater than a height of the first support.

5. The image sensor package of claim 1, wherein the filter layer is disposed not to vertically overlap at least one of the one or more second regions and the one or more fourth regions.

6. The image sensor package of claim 5, wherein the filter layer is disposed to:
vertically overlap the one or more second regions; and
not vertically overlap the one or more fourth regions.

7. The image sensor package of claim 1, wherein the first region and the filter layer are spaced apart from each other by the molding member.

8. The image sensor package of claim 1, further comprising at least one passive element disposed between the first support and the second support on the printed circuit board,
wherein the molding member surrounds the passive element.

9. The image sensor package of claim 1, wherein:
the first region has a first width; and
a maximum width of the one or more second regions is greater than a maximum width of the first region.

10. The image sensor package of claim 1, wherein:
the third region has a third width; and
a maximum width of the one or more fourth regions is greater than a maximum width of the third region.

11. The image sensor package of claim 1, wherein:
the one or more second regions include a plurality of second regions; and
at least one of a height and a width of some of the plurality of second regions is greater than at least one of a height and a width of the other of the plurality of second regions.

12. The image sensor package of claim 1, wherein an area of the filter layer is:
greater than an area of an active area of the image sensor; and
smaller than an area of the printed circuit board.

13. The image sensor package of claim 12, wherein the area of the filter layer is smaller than the area of the printed circuit board formed by a region in which the second support is disposed.

14. The image sensor package of claim 1, wherein:
the first support is disposed in a quadrangular shape along an edge of the image sensor; and
the second support is disposed in a circular or oval shape on the printed circuit board.

15. An image sensor package comprising:
a printed circuit board;
an image sensor disposed on the printed circuit board;
a first support disposed on the image sensor;
a filter layer disposed on the image sensor;
a second support disposed on the printed circuit board at a side surface of the image sensor;
a wire disposed between the first support and the second support and having one end connected to the image sensor and the other end connected to the printed circuit board; and
a molding member filling between the first support and the second support,
wherein a lower surface of the filter layer is in contact with the molding member and at least one of the first support and the second support,
wherein the first support includes a first region having a first height based on an upper surface of the printed circuit board, and one or more second regions connected to the first region and formed higher than the first height based on the upper surface of the printed circuit board,
wherein the second support includes a third region having a third height based on the upper surface of the printed circuit board and one or more fourth regions connected to the third region and formed higher than the third height based on the upper surface of the printed circuit board,
wherein the one or more fourth regions include a plurality of fourth regions; and
wherein at least one of a height and a width of some of the plurality of fourth regions is greater than at least one of a height and a width of the other of the plurality of fourth regions.

16. A camera device comprising:
an image sensor package; and
a lens assembly disposed on the image sensor package,
wherein the image sensor package includes:
a printed circuit board,
an image sensor disposed on the printed circuit board,
a first support disposed on the image sensor,
a filter layer disposed on the image sensor,
a second support disposed on the printed circuit board at a side surface of the image sensor,
a wire disposed between the first support and the second support and having one end connected to the image sensor and the other end connected to the printed circuit board, and
a molding member filling between the first support and the second support,
wherein a lower surface of the filter layer is in contact with the molding member and at least one of the first support and the second support,
wherein the first support includes a first region having a first height based on an upper surface of the printed circuit board, and one or more second regions connected to the first region and formed higher than the first height based on the upper surface of the printed circuit board,
wherein the second support includes a third region having a third height based on the upper surface of the printed circuit board and one or more fourth regions connected to the third region and formed higher than the third height based on the upper surface of the printed circuit board; and
wherein the filter layer is disposed to vertically overlap at least a part of the first region and the third region.

17. The camera device of claim 16, wherein:
the printed circuit board includes a plurality of rigid regions and a flexible region connecting the plurality of rigid regions;
the printed circuit board is foldable through the flexible region; and
the image sensor is disposed on one of the plurality of rigid regions.

* * * * *